United States Patent [19]
Fukumoto

[11] Patent Number: 5,394,360
[45] Date of Patent: Feb. 28, 1995

[54] NON-VOLATILE LARGE CAPACITY HIGH SPEED MEMORY WITH ELECTRON INJECTION FROM A SOURCE INTO A FLOATING GATE

[75] Inventor: Takahiro Fukumoto, Ikoma, Japan

[73] Assignee: Sharp Kabushiki Kaisha, Osaka, Japan

[21] Appl. No.: 77,953

[22] Filed: Jun. 18, 1993

Related U.S. Application Data

[63] Continuation of Ser. No. 725,456, Jul. 3, 1991, abandoned.

[30] Foreign Application Priority Data

Jul. 6, 1990 [JP] Japan .................. 2-180092

[51] Int. Cl.$^6$ ............................................ G11C 11/40
[52] U.S. Cl. ................... 365/185; 257/315; 257/318; 257/316
[58] Field of Search ................ 357/23.5, 23.14, 23.6; 257/323, 324, 315, 318, 321, 408, 316, 317, 239, 261, 317; 365/185

[56] References Cited

U.S. PATENT DOCUMENTS

| | | | |
|---|---|---|---|
| 4,943,836 | 7/1990 | Mori | 357/23.5 |
| 5,033,023 | 7/1991 | Hsia et al. | 357/23.5 |
| 5,053,841 | 10/1991 | Miyakawa et al. | 257/408 |
| 5,153,691 | 10/1992 | Guterman | 257/321 |
| 5,231,299 | 7/1993 | Ning et al. | 257/321 |
| 5,280,446 | 1/1994 | Ma et al. | 365/185 |

FOREIGN PATENT DOCUMENTS

| | | | |
|---|---|---|---|
| 87491 | 7/1980 | Japan | 357/23.5 |
| 96771 | 6/1984 | Japan | 357/23.5 |
| 59-96771 | 6/1984 | Japan | 357/23.5 |
| 60-144978 | 7/1985 | Japan | 257/321 |
| 61-216482 | 9/1986 | Japan | 257/316 |
| 45862 | 2/1988 | Japan | 357/23.5 |
| 63-45862 | 2/1988 | Japan | 357/23.5 |
| 172471 | 7/1988 | Japan | 357/23.5 |

OTHER PUBLICATIONS

Kupec et al., "Triple Level Poly Silicon E$^2$PROM with Single Transistor per bit" IEEE IEDM 1980, pp. 602–606.

Primary Examiner—Eugene R. LaRoche
Assistant Examiner—Vu Le
Attorney, Agent, or Firm—Nixon & Vanderhye

[57] ABSTRACT

A non-volatile semiconductor memory providing a semiconductor substrate, drain and source regions which are provided on the surface of the semiconductor substrate and have a conductivity type different from that of the semiconductor substrate, a channel region formed between the drain and source regions, a floating gate (first gate electrode) for covering a part of the channel region. The drain region is self-aligned with the floating gate, and the source region is offset from the floating gate through an offset region by a constant distance. As a result, the drain and source regions are located asymmetrically with respect to the floating gate. A control gate (second gate electrode) substantially controls the surface potentials on the underside and in the vicinity of the floating gate. A selection gate (third gate electrode) controls the surface potential of the whole channel region including the offset region. The control gate as the second gate electrode is directly capacitively-coupled with the floating gate wholly (or partially) in portions other than the offset region. The selection gate is the third gate electrode is provided above the control gate and the floating gate so as to overlap with the control gate over all of the channel region, whereby electrons are injected from the source region to permit electrical writing and erasure.

2 Claims, 2 Drawing Sheets

NON-VOLATILE LARGE CAPACITY HIGH SPEED MEMORY WITH ELECTRON INJECTION FROM A SOURCE INTO A FLOATING GATE

This is a continuation of application Ser. No. 07/725,456, filed Jul. 3, 1991, now abandoned.

BACKGROUND OF THE INVENTION

1. Field of the Invention

The present invention relates to a non-volatile semiconductor memory suitable for high integration, and more particularly to a non-volatile semiconductor memory capable of performing electrical writing and erasure which is characterized by electron injection from a source side.

2. Description of the Prior Art

Referring to a conventional non-volatile semiconductor memory shown in FIG. 5, an N-type drain region 21 and an N-type source region 22 are provided on the surface of a P-type semiconductor substrate 20. A three-layer film 27 is provided apart from the source region 22 by a constant distance. The three-layer film 27 includes a floating gate 23, a layer insulation film 24 and a control gate 25. A side wall electrode 26 is formed on the three-layer film 27. With the above-mentioned structure, the optimum potentials are applied to the side wall electrode 26 and the control gate 25, respectively. As a result, electrons can be injected to the floating gate from the source side.

Referring to the conventional non-volatile semiconductor memory, a side wall portion 26 is formed on the three-layer film 27 having the floating gate 23 on a self-control basis and is used as an electrode. Consequently, the whole manufacturing steps are very complicated.

Furthermore, the side wall portion 26 is also used for wiring. In this case, wiring resistance is increased so that signals are delayed. Accordingly, the side wall portion 26 can be used only in situations where a delayed signal response can be tolerated.

It is an object of the present invention to provide a non-volatile, large capacity, high speed semiconductor memory capable of performing electrical writing and erasure that is easy to manufacture and permits electron injection from a source side.

SUMMARY OF THE INVENTION

The present invention provides a non-volatile semiconductor memory comprising a semiconductor substrate, drain and source regions which are provided on the surface of the semiconductor substrate and have a conductivity type different from that of the semiconductor substrate, a channel region formed between the drain and source regions, a floating gate (first gate electrode) for covering a part of the channel region. The drain region is self-aligned with the floating gate, and the source region is offset from the floating gate through an offset region by a constant distance. As a result, the drain and source regions are located asymmetrically with respect to the floating gate. A control gate (second gate electrode) substantially controls the surface potentials and in the vicinity on the underside of the floating gate. A selection gate (third gate electrode) for controls the surface potential of the whole channel region including the offset region. The control gate as the second gate electrode is directly capacitively-coupled with the floating gate wholly (or partially) in portions other than the offset region. The selection gate as the third gate electrode is provided above the control gate and the floating gate so as to overlap with the control gate over all of the channel region, whereby electrons are injected from the source region to permit electrical writing and erasure.

DETAILED DESCRIPTION OF PREFERRED EMBODIMENTS

In general, it has been recognized by the inventors of the present invention that an offset region on a source side is slightly inverted. As a result, a voltage about twice as large as the voltage applied to a drain, must be applied to a floating gate by coupling capacitance in order to inject electrons from a source.

To apply a high potential only to the floating gate, a control gate as a second gate electrode is provided so as to be directly capacitively-coupled with the floating gate wholly or partially in portions other than the offset region. For the offset region to be slightly inverted, a selection gate as a third gate electrode is provided above the control gate including the floating gate so as to overlap with the control gate over a channel region. Consequently, this memory cell with a smaller area can be programmed by electron injection from the source.

A non-volatile semiconductor memory capable of performing electrical writing and erasure, which has the above-mentioned structure, can be operated by applying optimum potentials to the second and third gate electrodes, drain and source respectively as described below.

An example of the operation is as follows.

(1) Reading operation
  source potential . . . 0 V
  drain potential . . . 1 to 2 V
  second gate electrode . . . Vcc
    (supply voltage: 5 V)
  third gate electrode . . . Vcc
    (supply voltage: 5 V)

(2) Writing operation
  source potential . . . 0 V
  drain potential . . . 4 to 5 V
  second gate electrode . . . about twice as large as a drain voltage which is the same as the potential applied to the floating gate by coupling capacitance (for example, 14 to 15 V if the coupling capacitance ratio of the second gate electrode to the floating gate is 0.7)
  third gate electrode . . . almost the same as a threshold voltage of the offset region (for example, 1.5 V)

(3) Erasing operation
  source potential . . . Float
  drain potential . . . the potential which is necessary for drawing the electrons from the floating gate to the drain side by F-N tunneling (for example, about 15 V)
second gate electrode ... 0 V
third gate electrode ... 0 V Preferred embodiments of the present invention will be described in more detail with reference to the drawings.

Figure 1:
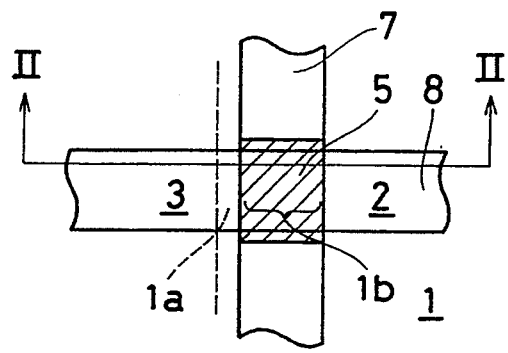
FIG. 1 is a plan view for explaining a structure according to a first embodiment of the present invention.
Figure 2:
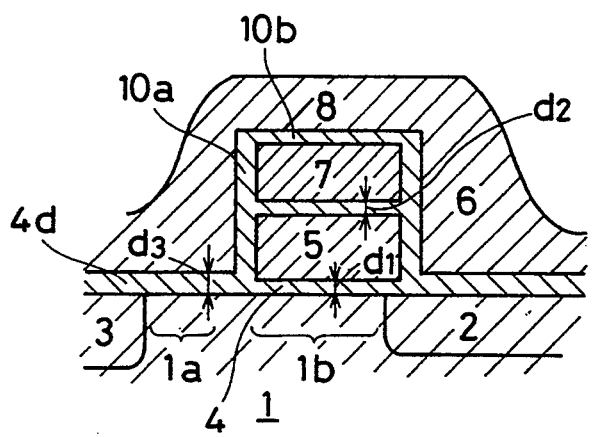
FIG. 2 is a perspective view along the line II—II of FIG. 1.

FIGS. 1 and 2 show a first embodiment of the present invention.

In FIGS. 1 and 2, the non-volatile semiconductor memory comprises an N-type drain region 2, an N-type source region 3, an offset region 1a and a region 1b on the surface of a P-type Si substrate 1. A floating gate 5 is provided in the region 1b. A channel region includes the offset region 1a and the region 1b. The drain region overlaps with the floating gate 5 on a self-aligning basis. The source region 3 is spaced apart from the floating gate 5 through the offset region 1a by a constant distance, e.g., generally in the range of 0.5 to 0.8 μm. The offset region 1a need only be sufficient distance to enable operation of that region as a transistor channel.

The non-volatile semiconductor memory comprises a thin $SiO_2$ gate insulating film 4 and a $SiO_2$ film 4a. The $SiO_2$ gate insulating film 4 covers the region 1b and has a thickness d1 of 100 Å. The $SiO_2$ film 4a covers the offset region 1a and has a thickness d3 of 170 Å. The gate insulating film 4 has the polysilicon floating gate 5 thereon. The floating gate 5 overlaps with the drain 2 and is provided apart from the source 3 through the offset region 1a. A second gate electrode (control gate) 7 is provided just above the floating gate 5 through an ONO (oxide-nitride-oxide) layer insulation film 6. The ONO layer insulation film 6 has a thickness of 200 Å. In addition, the second gate electrode 7 is provided so as not to enter (overlap) the offset region 1a and to be directly capacitively-coupled with the whole surface of the floating gate 5.

A third gate electrode (selection gate) 8 is provided over the entire channel region. On the source side, the third gate electrode 8 is directly capacitively-coupled with the offset region 1a, which is not covered by the floating gate 5, through the $SiO_2$ film 4a. In addition, the third gate electrode 8 is indirectly capacity-coupled with the floating gate 5 wholly through the second gate electrode 7. $SiO_2$ films for insulating the gates 5, 7 and 8 are indicated at 10a and 10b.

The non-volatile semiconductor memory of the present embodiment has the above-mentioned structure. Accordingly, if the optimum potentials, i.e., 0 V, 2 V, about 5 V and about 5 V are applied to the source potential, drain potential, second gate electrode and third gate electrode respectively, the reading operation can be performed.

Figure 3:
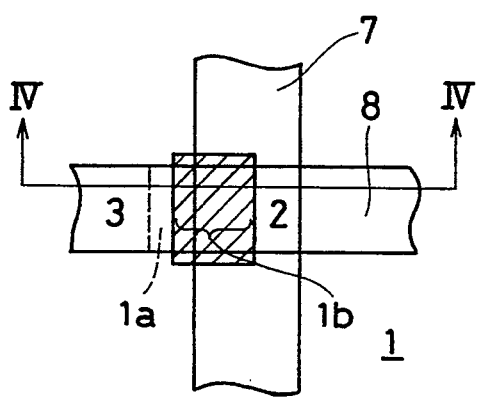
FIG. 3 is a plan view for explaining a structure according to a second embodiment of the present invention.
Figure 4:
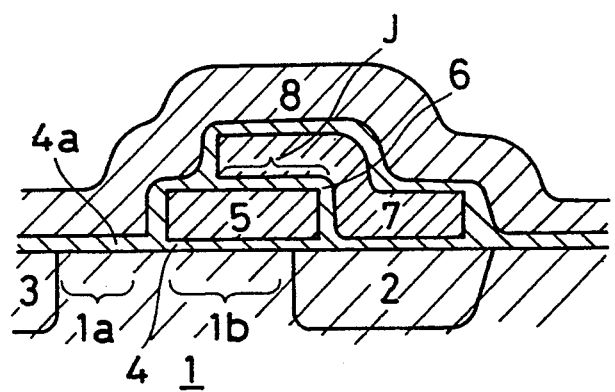
FIG. 4 is a perspective view along the line IV—IV of FIG. 3.
Figure 5:
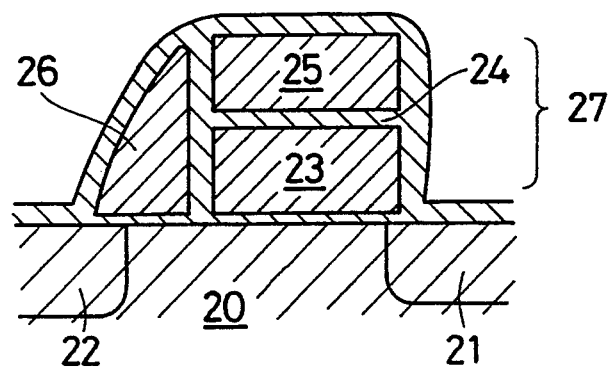
FIG. 5 is a view for explaining a structure according to the prior art.

FIGS. 3 and 4 show a second embodiment of the present invention in which a second gate electrode 7 is provided so as to partially overlap with and to be directly capacitively-coupled with a floating gate S in a J region, and a third gate electrode 8 is provided all over a channel region so as to be partially indirectly capacitively-coupled with the floating gate 5 partially through the second gate electrode 7.

The structure and operation of the present embodiment are the same as in the first embodiment except for the foregoing. By way of example, if the source potential, drain potential, second and third gate electrodes are respectively set to the optimum values of 0 V, 4 to 5 V, 14 to 15 V and 1.5 V as described above, the writing operation can be performed by the electrons from a source.

A non-volatile semiconductor memory according to the present invention comprises a semiconductor substrate, drain and source regions which are provided on the surface of the semiconductor substrate and have a conductivity type differently from that of the semiconductor substrate, a floating gate (first gate electrode) for covering a part of a channel region between the drain and source regions, the drain region being self-aligned with the floating gate, the source region being provided apart from the floating gate through an offset region by a constant distance, whereby the drain and source regions are asymmetrical to each other through the floating gate, a second gate electrode for substantially controlling the surface potentials only on the underside of the floating gate and in the vicinity thereof, and a third gate electrode for controlling the surface potential of the whole channel region which substantially includes the offset region, the second gate electrode being provided so as to be directly capacitively-coupled with the floating gate wholly or partially in portions other than the offset region, the third gate electrode being provided so as to be directly capacitively-coupled with the offset region and to be indirectly capacitively-coupled with the floating gate wholly or partially through the second gate electrode. Consequently, there can be eliminated the following drawbacks of the prior art.

(i) Since a side wall is used as an electrode, it is difficult to manufacture the non-volatile semiconductor memory.

(ii) Since a side wall portion is used for wiring, a wiring resistance is increased so that signals are delayed. Thus, the side wall portion can be used only in the case where problems are not caused even if a response is delayed.

According to the present invention, furthermore, it is possible to form a memory cell having a smaller area. In addition, the present invention permits stable electron injection from a source.

What is claimed is:

1. A non-volatile semiconductor memory where information is written in the memory by injecting electrons into a floating gate from a source, comprising:
   a semiconductor substrate;
   drain and source regions provided on a surface of the semiconductor substrate having a conductivity type different from another conductivity type of the semiconductor substrate;
   a channel region formed between the drain and source regions divided into first and second portions;
   the floating gate covering the second portion of the channel region and aligned with the drain region, the source region being offset by the first portion of the channel region from the floating gate and the drain and source regions being asymmetrically located with respect to the floating gate;
   a control gate electrode for substantially controlling surface potentials under and in the vicinity of the floating gate, wherein the control gate electrode is directly capacitively-coupled with at least a portion of the floating gate electrode; and
   a selection gate electrode for directly controlling surface potentials of the first portion of the channel region, wherein the selection gate electrode is transverse to the control gate electrode and is formed (1) over an entire width of the control gate electrode, (2) over a substantial portion of the floating gate electrode, (3) over the entire channel region, and (4) over at least a portion of the drain and source regions;

wherein the control gate electrode overlaps said at least a portion of the floating gate electrode, and the selection gate electrode overlaps and is directly capacitively-coupled with another portion of the floating gate electrode and with the first portion of the channel region and is partially indirectly capacitively-coupled with the floating gate electrode through the control gate electrode.

2. A nonvolatile semiconductor memory according to claim 1 wherein the memory comprises memory cells, each memory cell having control gate electrodes and selection gate electrodes positioned transversely at right angles to each other.

* * * * *